Feb. 16, 1971 D. N. LEE 3,564,440

DC COUPLED DIFFERENTIAL AMPLIFIER

Filed Oct. 31, 1969 3 Sheets-Sheet 1

INVENTOR
DON N. LEE
BY
Maleson, Kimmelman & Ratner
ATTORNEYS.

INVENTOR
DON N. LEE
BY
Maleson, Kimmelman & Ratner
ATTORNEYS.

INVENTOR
DON N. LEE
BY
Maleson, Kimmelman & Ratner
ATTORNEYS.

United States Patent Office 3,564,440

Patented Feb. 16, 1971

3,564,440

DC COUPLED DIFFERENTIAL AMPLIFIER

Don N. Lee, Willingboro, N.J., assignor to
Computer Test Corporation

Filed Oct. 31, 1969, Ser. No. 872,962
Int. Cl. H03f 3/68

U.S. Cl. 330—30 9 Claims

ABSTRACT OF THE DISCLOSURE

A gain controlled wideband DC coupled differential amplifier having a fast response time in which the DC potentials at the outputs of the amplifier are maintained constant and equal in value as the gain is varied. To vary the gain, portions of the differential load resistances are short circuited and simultaneously compensating resistances are coupled to the load resistances. At the same time, the supply potential is varied in a direction tending to maintain constant the DC potentials.

BACKGROUND OF THE INVENTION

(A) Field of the invention

This invention relates to the field of art of wideband DC coupled differential amplifiers in which the gain is controlled.

(B) Prior art

DC coupled differential amplifiers are known in which the gain may be varied to predetermined values. In such amplifiers, it is a requirement that as the gain is varied the DC potentials remain constant since any such change would indicate an error output signal. Specifically as the gain is varied, the DC potential at each output terminal of the differential amplifier is required to be maintained constant and the DC potentials measured at the two output terminals are required to be maintained equal to each other.

Prior DC differential amplifiers have left much to be desired in achieving the foregoing requirements particularly when the varying gain has been remotely controlled and the amplifier has a wide bandwidth and a substantially fast response time. In a specific prior DC coupled differential amplifier, the gain has been varied by using a rotary switch. However, this switching device is inherently slow. The resultant long lead lengths in the load circuit produce objectionable frequency response and are incompatible with a wide bandwidth amplifier. In other prior systems, relays have been used in order to decrease the lead lengths. However such systems have inherently slow response times. Other prior systems have used FET transistors which, though providing faster response time, have an undesirable substantial turn on resistance.

SUMMARY OF THE INVENTION

A gain controlled wideband DC coupled differential amplifier having fast response time comprising at least one differential amplifier stage without capacitive coupling. The amplifier stage has a first and a second load resistor network. A gain control circuit is operable in response to input signals for producing control signals. In response to the control signals, portions of the first and second resistor networks are shunted to vary the gain by a predetermined value. A supply potential is applied to the resistor networks having a value which is variable in response to the control signals and is in a direction tending to maintain constant the DC potentials at the amplifier outputs as the gain is varied. Additionally, predetermined values ofcompensating resistances are coupled to the first and second resistor networks upon application of the control signals to compensate for variations in resistance values between the shunted resistor networks. In this manner, the DC potentials at the outputs of the amplifier are maintained constant and equal in value as the gain is varied.

BRIEF DESCRIPTION OF THE DRAWINGS

Referring now to FIG. 1, there is shown, in simplified form, a differential amplifier 10 the gain of which is controlled by a gain switch control 15. Differential amplifier 10 comprises a first and a second differential amplifier stage 11 and 12 both of which are DC coupled (no capacitive coupling) and together provide for amplifier 10 a wide bandwidth, as for example, 100 megacycles and a substantially fast response time to gain switching, as for example, for switching in less than one microsecond.

Figure 1:
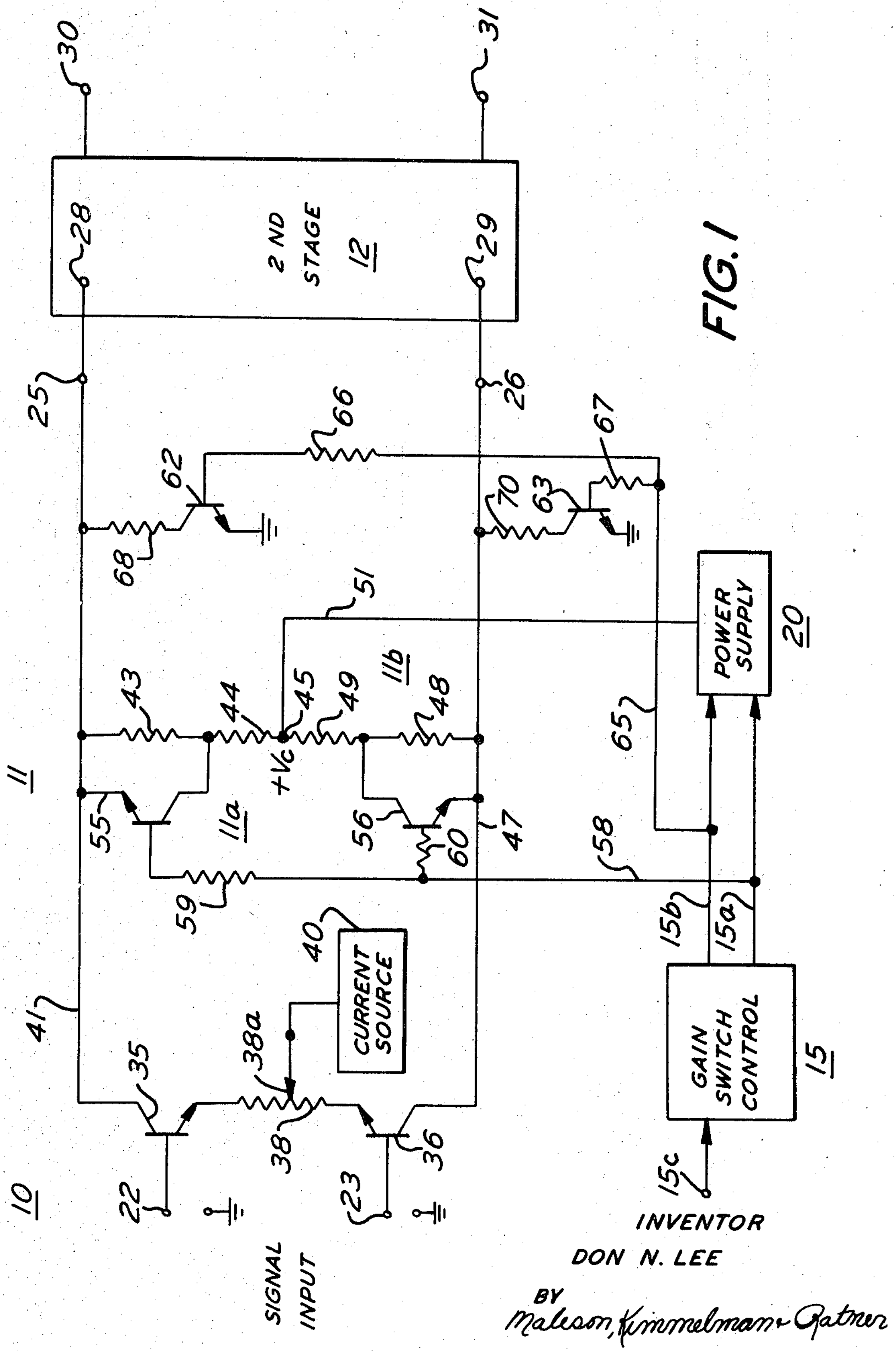
FIG. 1 illustrates in simplified schemateic form a differential amplifier in which the gain is controlled and compensation is provided in accordance with the invention.

Differential amplifier 10 has first and second input terminals 22 and 23 which comprise the input terminals for first stage 11. Each of the input terminals is referenced with respect to a grounded input terminal. The first stage 11 has differential output terminals 25 and 26 which are directly connected to second stage input terminals, 28 and 29 respectively. The second stage output terminals 30 and 31 comprise the output terminals of differential amplifier 10.

In the manner later to be described in detail, the gain of first amplifier stage 11 may be varied to have either one of two values of gain which is determined by selecting the values of the load resistances of the first stage. In accordance with the invention, the DC potentials at each of output terminals 25 and 26 is maintained constant in value when the gain is changed from one to the other of its two values. In addition, the DC potentials measured at terminals 25 and 26 are maintained equal to each other as the gain is changed. This maintenance of the DC potential at output terminals 25 and 26 is essential since the magnitude of the DC potential at output terminals 30 and 31 for differential amplifier 10 is a paramater of the differential amplifier and this parameter is required to remain constant.

Amplifier 10 input terminals 22 and 23 are directly connected to the bases of first and second NPN transistors 35 and 36 respectively which comprise the differential amplifier transistors of first stage 11. Specifically, the emitter of transistor 35 is connected by way of the resistance element of a balancing potentiometer 38 to the emitter of transistor 36. The movable arm 38*a* of potentiometer 38 is connected to a current source 40 which is effective to apply a constant current to potentiometer 38. The collector of first transistor 35 is connected by way of a conductor 41 to output terminal 25 and also by way of load resistors 43 and 44, to $+V_c$ junction 45 which is defined as the first half 11*a* of the first differential stage 11. Similarly, the collector of second transistor 36 is connected by way of a conductor 47 to output terminal 26 and also by way of load resistors 48 and 49 to junction 45 which is defined as the second half 11*b* of the first differential stage 11. The potential $+V_0$ at junction 45 which is the collector potential with respect to ground potential is supplied by way of a conductor 51 from a power supply 20.

The gain is changed by simultaneously short circuiting resistors 43 and 48 by way of NPN saturated switch transistors 55 and 56 respectively. It will be initially assumed that transistors 55 and 56 are switched to their nonconductive states by gain switch control 15. Thus the gain of each half stage 11$a$–$b$ is determined by the resistance value of a pair of load resistors in series, viz., resistor networks 43 and 44, and resistor networks 48 and 49 respectively. Accordingly, the gain of first stage 11 is at the higher one of its two values which may produce, for example, a times fifty gain for amplifier 10.

In this high gain state, potentiometer arm 38$a$, setting is varied until the DC potentials measured at terminals 25 and 26 are equal to each other. One of the reasons that such "DC balance" is required is that transistors 35 and 36 have differing values of $V_{be}$ even if these transistors are matched. Thus, by varying the setting of arm 38$a$ the $V_{be}$ of transistors 35 and 36 are effectively made equal to each other. While it is possible to select transistors to have values of $V_{be}$ which are substantially similar to each other, it is not feasible to obtain exactly equal values. Accordingly, by varying arm 38$a$ the potential between the arm and terminal 22 is made equal to the potential between the arm and terminal 23.

Another reason for varying the setting of arm 38$a$ is to compensate for any variation between the series resistance values of the resistor pair 43 and 44 of half stage 11$a$ and resistor pair 48 and 49 of half stage 11$b$. Specifically, the constant current developed by current source 40 may be traced in two paths starting at junction 45 with a first path through resistors 44, 43, conductor 41, transistor 35, and potentiometer 38 to source 40. The other path is from junction 45, resistors 49, 48, conductor 47 and through transistor 36 and potentiometer 38 to source 40. In this manner, the constant current divides equally through each pair. However, if the pairs of resistors have different values, the voltage drops across the pairs will be different thereby producing an undesirable differing DC potential at terminals 25 and 26. Accordingly, by varying the setting of arm 38$a$, there is achieved a DC balance with the DC potential at terminal 25 being equal to that of terminal 26.

In the manner previously described, the gain of first stage 11 is at the lower one of its two values when transistors 55 and 56 are rendered conductive. Specifically, the emitter and collector of transistor 55 are connected across resistor 43 and the emitter and collector of transistor 56 are connected across resistor 48. Output 15$a$ of control 15 is applied by way of a conductor 58 and a resistor 59 to the base of transistor 55 and by way of a resistor 60 to the base of transistor 56. Accordingly, upon application of a positive going signal from output 15$a$, both transistors 55 and 56 are simultaneously turned on thereby shunting resistors 43 and 48 respectively with the saturation resistances of the respective transistors. Since the saturation resistances are finite values close to zero, the shunts may be generally defined as short circuits. Thus, in the low value gain state only resistors 44 and 49 effectively operate as the load resistances for half-stages 11$a$–$b$ respectively.

It will be understood that with the foregoing change in load resistances for each of the half stages that the potentials at output terminals 25 and 26 increase in absolute magnitude. This increase in absolute magnitude potential will be understood when it is considered that with transistor 55 turned on the potential at terminal 25 is equal to $V_c$–I (resistor 44), with I being the current flow through conductor 41. On the other hand, with transistor 55 turned off, the potential at terminal 25 is equal to $V_c$–I (resistors 44 and 43), with I being the current flow through conductor 47. In order to maintain the DC potentials at each of terminals 25 and 26 constant in value as the gain is changed from the high to the low value, it is necessary that the value of the potential at $V_c$ junction 45 decrease in absolute magnitude to compensate for the change. Conversely, when the gain is increased from its low to its higher value, the absolute magnitude of $V_c$ is required to increase in absolute value to compensate for the change. This change in absolute value $V_c$ is provided by power supply 20 which is controlled by control signals applied by way of outputs 15$a$–$b$ from gain switch control 15. Accordingly, simultaneous with the switching of transistors 55 and 56, power supply 20 is switched in a direction to maintain constant the values of potential at terminals 25 and 26.

It will be understood that when transistors 55 and 56 are turned on that there will be some unbalance in the values of the potentials at terminals 25 and 26 resulting from an unbalance in the saturation resistances of transistors 55 and 56. While these transistors are selected to have matched saturation resistances, there will usually be some difference in such resistance values. Accordingly, the resultant load resistance value for each half stage in the low value gain state will not be exactly equal to each other. Thus, not only will there be an unbalance in the values of the DC potentials at terminals 25 and 26 causing steady state unbalance but there will also be a transient unbalance.

In order to compensate for the foregoing unbalance, unbalancing circuits are provided comprising transistors 62 and 63. When transistors 55 and 56 are turned on, transistors 62 and 63 are also turned on by a signal from output 15$b$ applied through conductor 65 and by way of a resistor 66 to the base of transistor 62 and by way of a resistor 57 to the base of transistor 63. In the unbalancing circuit for half stage 11$a$, terminal 25 is connected by way of a resistor 68 and the collector, base, and emitter of transistor 62 to ground. In the unbalancing circuit for half stage 11$b$, terminal 26 is connected by way of a variable resistor 70, the collector, base and emitter of transistor 63 to ground. Resistor 70 may be adjusted to be larger or smaller in resistance value than resistor 68. Accordingly, in the low value gain state, resistor 68 is effectively connected in parallel with the load or collector resistance circuit of half stage 11$a$ while resistor 70 is effectively connected in parallel with the load resistance circuit of half stage 11$b$. Thus, with transistors 55, 56, 62 and 63 turned on, by adjusting the value of resistor 70, the total load resistance values of each half stage may be made equal.

Figure 2A:
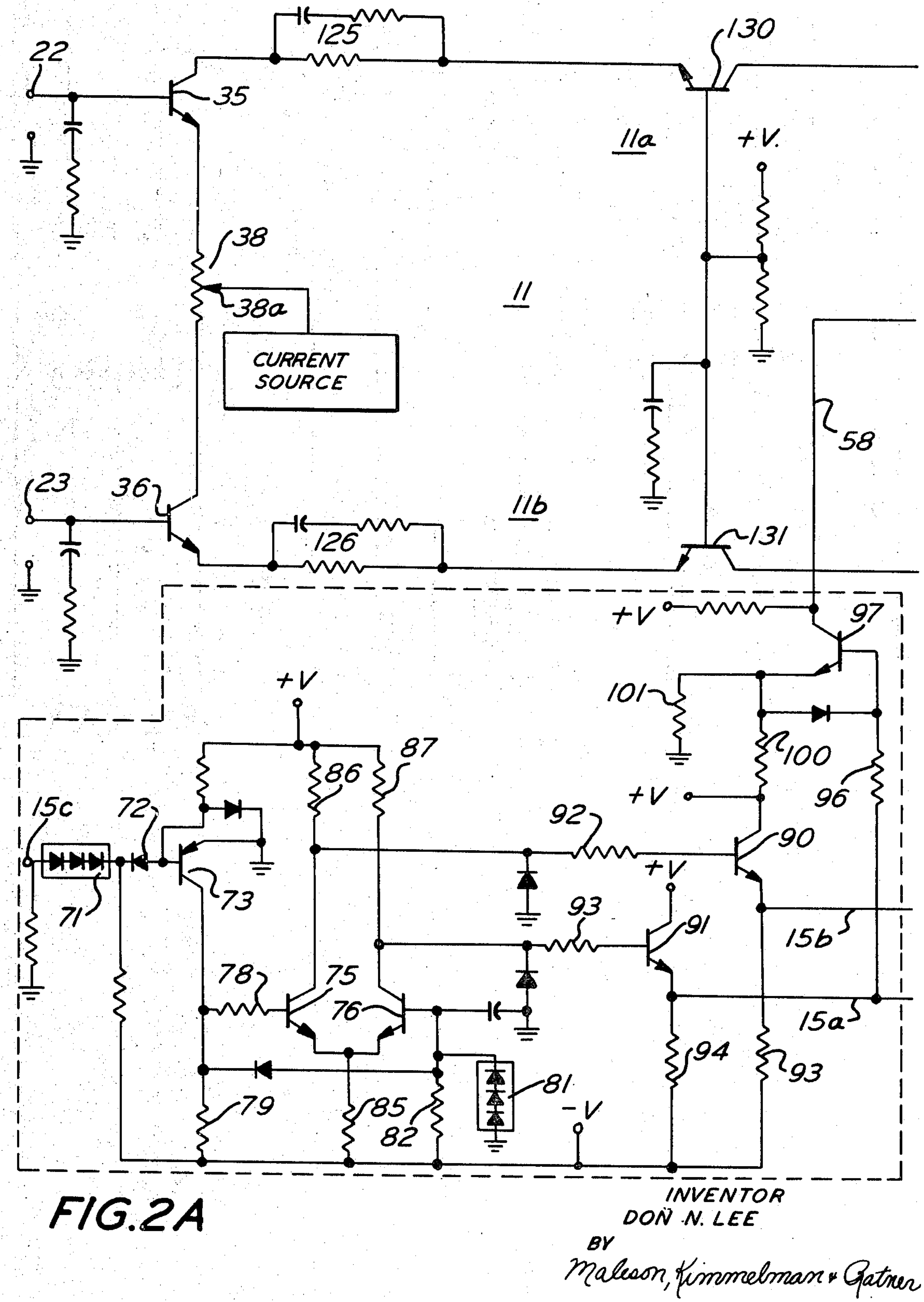
FIGS. 2A–B when taken together show in more detail the differential amplifier of FIG. 1.
Figure 2B:
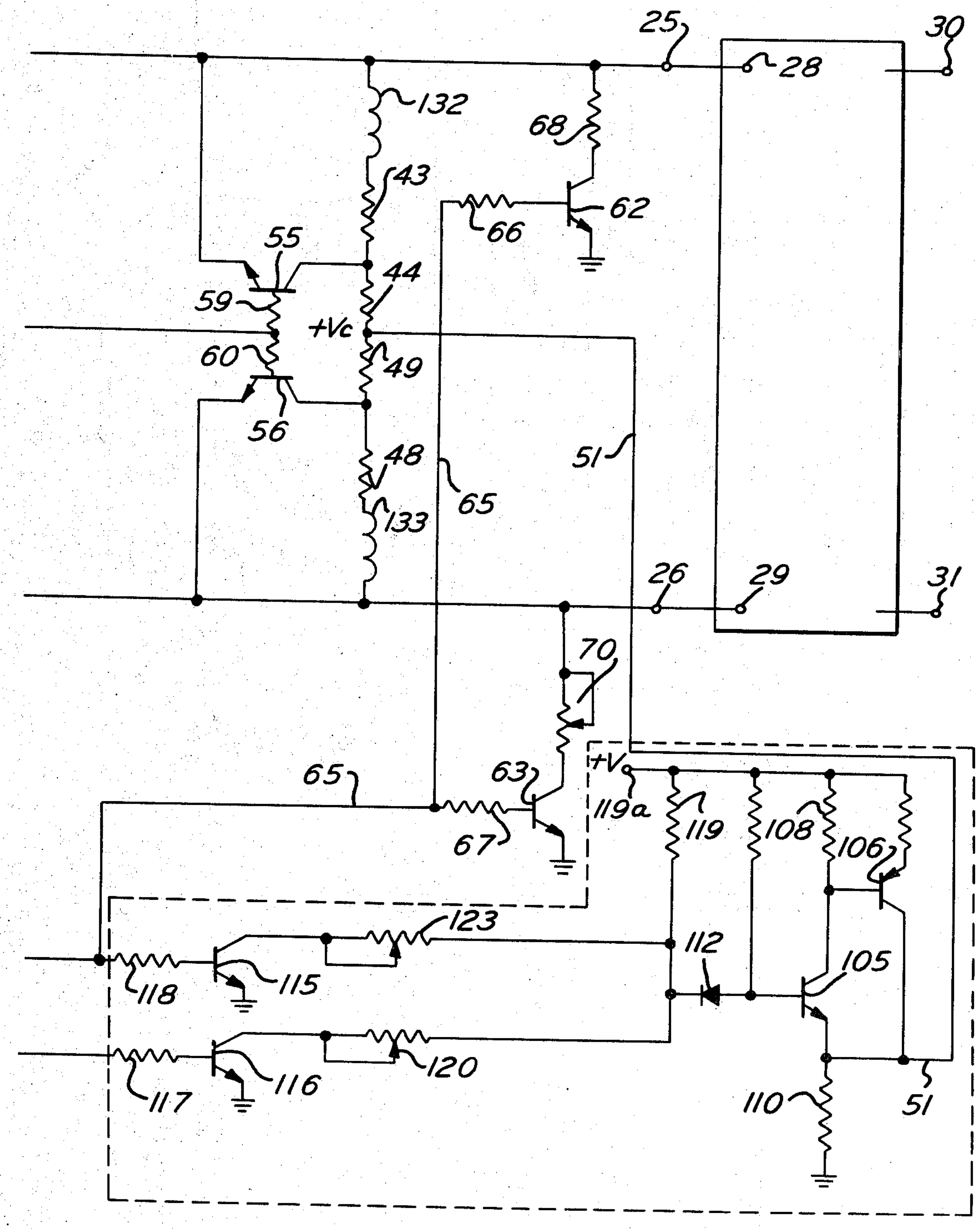

Referring now to FIGS. 2A–B there is shown in detail first stage 11, gain switch control 15 and power supply 20. A DC potential is applied as a remote gain control signal to input terminal 15$a$ of control 15. For example, the DC potential may be a zero value and control 15 provides signals at outputs 15$a$–$b$ to switch stage 11 to the high value gain state. On the other hand, a DC potential of +3 volts is effective to produce a low value gain state. The DC potential applied to terminal 15$c$ is transmitted through level shifting diodes 71 and 72 to the base of an inverting PNP transistor 73. The collector output of transistor 73 is used to drive one base of a differential pair of NPN switching transistors 75 and 76.

In the discussion to follow, it will be assumed that a zero value signal is applied to input 15$c$. The collector of transistor 73 is connected by way of a resistor 78 to the base of transistor 75 and also by way of a load resistor 79 to a negative potential source of supply. The base of the other transistor 76 of the pair has a DC potential of −1.5 volts applied thereto which is established by series diodes 81 connected to ground and by a resistor 82 connected to a negative supply. The emitters of transistors 75 and 76 are connected together and by way of a resistor 85 to the negative supply. Further, the collectors of transistors 75 and 76 are connected by way of respective resistors 86 and 87 to a positive source of supply.

With the input DC potential at terminal 15$c$ at zero volts, transistor 73 is turned on. Since the emitter of transistor 73 is grounded, the base of transistor 75 becomes more positive in potential thereby turning on transistor 75 which is effective to turn off transistor 76. The collector outputs of transistors 75 and 76 are respectively connected to the bases of NPN emitter follower transistors 90 and 91 by way of respective resistors 92 and 93. A positive source of supply is connected to the collectors of each of transistors 90 and 91 and the emitters thereof are connected by way of resistors 93 and 94 respectively to a negative supply. With transistor 75 turned on, the collector thereof is at approximately ground potential and with transistor 76 turned off, its collector is at approximately +12 volts, for example.

The emitter output of transistor 90, viz., output 15*b*, is applied by way of conductor 65 to drive the bases of balancing transistors 62 and 63 in the manner previously described. Accordingly, with a zero potential input signal applied to terminal 15*c*, transistors 62 and 63 are turned off since the output potential of transistor 90 is slightly negative with respect to ground. On the other hand the emitter output of transistor 91, viz., output 15*a*, is at approximately +12 volts which is applied by way of a resistor 96 to the base of an inverting transistor 97. The emitter of transistor 97 is maintained at a constant potential, as for example, +8 volts by its connection to the junction of resistors 100 and 101 with the other end of resistor 101 being connected to a positive supply and the other end of resistor 101 being connected to ground. Accordingly, with transistor 76 turned off, transistor 97 is turned on and its collector is at approximately +8 volts. That +8 volt signal is effective by way of conductor 58 to turn off transistors 55 and 56 since the emitters thereof are connected to a positive supply.

There has now been explained how transistors 55, 56, 62 and 63 are turned off with a zero volt input DC potential to terminal 15*c* for the high value gain state. In this state, it is also required that power supply 20 apply the higher one of two potentials to $+V_c$ junction 45.

Power supply 20 includes a unity gain power amplifier comprising transistors 105 and 106. The collector of NPN transistor 105 is connected to the base of transistor 106 and by way of a resistor 108 to a positive potential supply. In addition, the emitter of transistor 105 is connected (1) to the junction of the collector of transistor 106 and conductor 51 and (2) by way of a resistor 110 to ground. The base input of transistor 105 is connected to a temperature compensation diode. A pair of voltage divider networks provide the input signal through a diode 112 to the unitary gain amplifier of transistors 105 and 106. The voltage divider networks are under the control of respective NPN saturation switching transistors 115 and 116 the emitters of which are connected to ground. Outputs 15*a–b* are connected by way of resistors 117 and 118 to the bases of transistors 116 and 115 respectively.

Accordingly, with output 15*b* being slightly negative in potential, it will be understood that transistor 115 is turned off. On the other hand, with output 15*a* being at approximately +12 volts, transistor 116 is turned on. Accordingly, a voltage divider network may be traced from positive supply 119*a*, voltage divider resistor 119, and potentiometer 120, transistor 116 and then to ground. The junction of resistor 119 and potentiometer 120 is connected by way of diode 112 to the unity gain amplifier. Thus, potentiometer 120 may be adjusted to provide by way of conductor 51 a proper value $V_c$ for the high value gain state.

With the foregoing explanation of the operation of control 15 and supply 20 with respect to the high value gain state, the operation of the low value gain state will be evident. Specifically, upon application of +3 volts DC potential to input terminal 15*c*, transistor 73 is turned off which is effective to switch the differential pair so that transistor 75 is turned off and transistor 76 is turned on. Accordingly, a +12 volt potential is applied by way of output 15*b* and conductor 65 to turn on transistors 62, 73 and 115. With transistor 115 turned on, the voltage divider network for power supply 20 may be traced from positive supply 119*a* through resistor 19 and potentiometer 123 and transistor 115 to ground. With the junction of resistor 119 and potentiometer 123 connected to diode 112, potentiometer 123 may be varied in setting to produce the proper value $V_c$ for the low value gain state.

With transistor 76 turned on the potential at output 15*a* is slightly negative which is inverted by transistor 97 to apply a +12 volt signal to conductor 58 thereby turning on transistors 55 and 56.

It will be noted that first stage 11 as shown in FIGS. 2A–B includes the following components not shown in simplified FIG. 1. Transistors 35 and 36 are each connected in a cascade arrangement with transistors 130 and 131 respectively. Specifically, the collector of transistor 35 is connected by way of a frequency compensation network 125 to the emitter of NPN grounded base connected transistor 130. The collector of transistor 130 is connected to terminal 25 and through an inductor 132 to resistor 43. In similar manner, the collector of transistor 36 is connected by way of frequency compensation network 126 to the emitter of transistor 131, the collector of which is connected to terminal 26 and by way of inductor 133 to resistor 48. The bases of transistors 130 and 131 are connected together and through a voltage divider network 135 to a positive supply.

For the purposes of definition as used herein, in response to remote control input signals applied to terminal 15*c*, first and second control signals are produced at outputs 15*a–b*. A first control signal will be defined as switching amplifier 10 to the low value gain state in which transistors 55 and 56 are turned on and a low value supply potential is produced by supply 20. For the second control signal, the high value gain state is produced in which transistors 55 and 56 are turned off and a high value supply potential is produced.

What is claimed is:

1. A gain controlled wideband DC coupled differential amplifier system in which the DC potentials at the outputs of said amplifier system are maintained constant and equal in value as the gain is varied comprising, at least one differential amplifier stage without capacitive coupling having first and second resistance means, means connecting without capacitive coupling said first and second resistance means to said amplifier outputs, control means operable for producing first and second control signals, means in response to application of said first control signals to shunt portions of said first and second resistance means thereby to vary said gain by a predetermined value, power supply means for providing a supply potential to said first and second resistance means the value of which potential is variable in response to application of said control signals in a direction tending to maintain constant the DC potential at said amplifier outputs as said gain is varied, and means coupling predetermined compensating resistance values to said first and second resistance means in response to application of said first control signals tending to maintain said DC potentials equal in value as said first and second resistance means portions are shunted.

2. The differential amplifier system of claim 1 in which said differential amplifier stage includes a pair of amplification devices the output terminals of which are connected without capacitive coupling to a respective one of said first and second resistance means and DC balancing means including a source of current connected to another terminal of each amplification device for balancing said DC potential to equality in response to said second control signals.

3. The differential amplifier system of claim 1 in which said shunt means comprises a first and a second saturated switching transistor each having its emitter and collector connected across a respective portion of said first and second resistance means.

4. The differential amplifier system of claim 1 in which resistance compensating means comprises in series circuit a shunt resistor and a switching device which is rendered conductive upon application of said first control signal.

5. A gain controlled wideband DC coupled differential amplifier having fast response time in which the DC potentials at the two amplifier outputs are maintained constant and equal to each other as the gain is varied to either one of a predetermined high and low values comprising, at least one differential amplifier stage without capacitive coupling including first and second load resistance means each having substantially the same resistance value and each having a first and a second end, means connecting without capacitive coupling each first end to a respective one of said two amplifiers outputs, control means operable in response to remotely applied input signals for producing control signals, means connected to said control means to short circuit portions having substantially equal resistance values of said first and second resistance means upon application of said first control signal thereby to vary said gain from a high to a low value, power supply means coupled to said control means for applying to said second ends of said first and second resistance means (1) a first supply potential upon application of said first control signal and (2) a second supply potential of value greater than said first supply potential upon application of said second control signal, and first and second resistance compensating means coupled to said first ends of said first and second resistance means respectively and to said control means for providing a shunt resistance for said first and second resistance means respectively upon application of said first control signal, the values of said shunt resistances being selected to substantially compensate for differing resistance values provided by first and second short circuiting means whereby said power supply means and said first and second resistance compensating means cooperate to maintain said DC potentials at said two amplifier outputs constant and equal to each other.

6. The differential amplifier of claim 5 in which said differential amplifier stage includes a pair of transistors the output terminals of which are connected without capacitive coupling to a respective one of said first ends of said first and second resistance means and DC balancing means including a source of current connected to another terminal of each amplification device for balancing said DC potential to equality upon application of said second control signals.

7. The differential amplifier of claim 6 in which said first and second resistance means comprises respectively a first and a second pair of resistors, and in which said short circuit means comprises a first and a second saturated switching transistor each having its emitter and collector connected across one resistor of a respective one of said first and second pair of resistor means.

8. The differential amplifier of claim 7 in which each first and second reisstance compensating means comprises in series circuit a shunt resistor and a switching transistor which is turned on upon application of said first control signal, means for varying the resistance values of at least one of said shunt resistors to provide said selected resistance.

9. The differential amplifier of claim 8 in which said control means simultaneously applies said control signals to said short circuit means, said power supply means, said compensating means and said balancing means.

References Cited

UNITED STATES PATENTS

| | | | |
|---|---|---|---|
| 3,046,487 | 7/1962 | Matzen et al. | 330—22X |
| 3,491,306 | 1/1970 | Nielsen | 330—29 |

ROY LAKE, Primary Examiner

L. J. DAHL, Assistant Examiner

U.S. Cl. X.R.

330—22, 29